Sept. 8, 1970 A. A. GALVIN 3,528,040

ELECTRONICALLY VARIABLE FILTER

Filed Dec. 12, 1968

INVENTOR
AARON A. GALVIN
BY Joseph Weingarten
Stanley M. Schurgin
ATTORNEYS

United States Patent Office 3,528,040
Patented Sept. 8, 1970

3,528,040
ELECTRONICALLY VARIABLE FILTER

Aaron A. Galvin, Lexington, Mass., assignor to Aerospace Research, Inc., Boston, Mass., a corporation of Massachusetts Filed Dec. 12, 1968, Ser. No. 783,290
Int. Cl. H03h 7/10; H04b 3/04
U.S. Cl. 333—18 4 Claims

ABSTRACT OF THE DISCLOSURE

An electronically variable filter in which the filter response is easily and precisely varied by a control signal which can be derived from the filter output. A bank of equal value resistors are employed in an active filter and are coupled to an array of photosensitive resistors which are uniformly and controllably varied in resistance by sources of variable intensity light.

FIELD OF THE INVENTION

This invention relates to electronic filter circuits and more particularly to filter circuits, the response of which is selectively variable in accordance with an electrical control signal.

BACKGROUND OF THE INVENTION

Electronic filters are widely employed to discriminate in a particular manner between frequencies to suit particular operating requirements. Where a particular filter response is desired for particular input conditions, a circuit having the requisite response is, of course, available by well known circuit design techniques. In many instances, however, filters of different responses must be provided to accommodate varying input conditions or varying performance needs. One well known means of providing different filter response is to provide a bank of fixed filters which can be selectively switched into a system to provide the intended response. For many requirements, the number of filters can become quite large and this arrangement is quite complex, cumbersome and expensive as well as providing filter responses which are changeable only in an incremental manner. Filter circuits are known in which the response is varied by mechanical adjustment of frequency determining elements therein, for example, by a mechanically adjustable capacitor or resistor. Such filters must be either manually tuned to achieve a requisite response or complex mechanical driving systems must be provided to provide the necessary filter tuning. Certain other filters are known in which the response is varied by electrical control of frequency determining elements therein such as voltage controlled capacitors or inductors and while such electronically variable filters are satisfactory for some purposes, they generally are not useable at the lower audio frequencies or sub-audio frequencies by reason of the unavailability of variable capacitors of sufficiently high value or controllable inductors of practical size.

SUMMARY OF THE INVENTION

In accordance with the present invention, a complex active filter is provided, the response of which is easily and precisely controllable to achieve a desired response characteristic. The novel active filter employs as the frequency determining elements, a bank of equal value resistors which are controlled by an array of photosensitive resistors uniformly and controllably varied in resistance by sources of variable intensity light. The novel filter is especially useful in signal processing systems wherein time varying non-white noise is being cancelled, such as, for example, the cancellation of clutter received by a moving target radar. A control signal can be derived from the filter output and fed back to the controlling light sources in order to provide an adaptive filter which has a response selectively adjustable in accordance with predetermined input signal characteristics.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
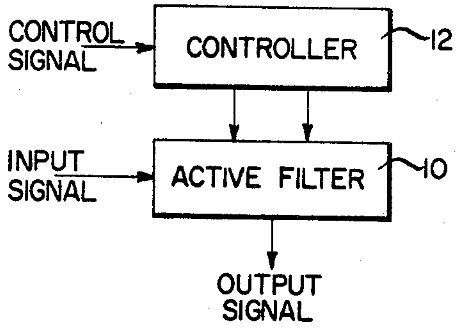
FIG. 1 is a diagrammatic representative of an electronically variable filter according to the invention.

The novel filter is shown diagrammatically in FIG. 1 and includes an active filter 10 operative to receive an input signal and to produce a filtered output signal, and a controller 12 coupled to filter 10 and operative in response to an applied control signal to precisely and selectively vary the response of filter 10. Filter 10 is an active filter in which the frequency determining elements are a bank of equal value resistors. Controller 12 includes an array of photosensitive resistors each coupled to a respective one of the equal value resistors in filter 10, the light sensitive resistors being variable in resistance in accordance with the intensity of a light source associated therewith, the light source being energized by the applied control signal. The variable control elements are, therefore, contained within controller 12, thus this controller can be fabricated in a unitary module and, likewise, filter 10 can be fabricated in a separate module, the modules being suitably interconnected to provide the complete variable filter.

The particular circuitry of module 10 can be chosen to yield a particular frequency response characteristic which may be desired in a particular instance, and in fact, a family of filter modules can be provided each compatible with a common controller module 12. In the manufacture of such electronically variable filters, therefore, only a single controller module need be provided which is useful with a variety of filter modules. Manufacturing efficiency is thereby enhanced by the provision of a controller module common to many filter modules. The controller 12 can also take a variety of forms depending on particular operating requirements. Typically, the controler comprises a plurality of series-connected light emitting solid state devices such as gallium arsenide phosphide diodes each operatively associated with a photosensitive resistor. Each pair of photosensitive and photoemitting elements can be assembled in a single package for ease of circuit connection as well as providing efficient optical control of the photosensitive resistor. The array of electro-optical elements are of matched characteristics so that variation in the control signal causes a corresponding and uniform variation in the resistance of the several photosensitive resistors. The controllable and uniform resistance variations, when coupled to the bank of equal value resistors in filter module 10, provides the intended selective adjustment of filter response.

Figure 2:
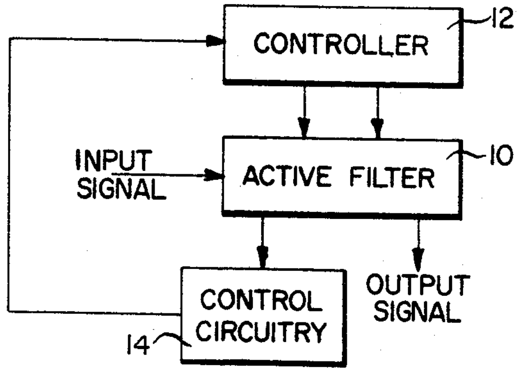
FIG. 2 is a diagrammatic representation of the invention employing adaptive control.

The control signal can be derived from a suitable source to suit particular operating requirements or the control signal can be derived from the filter output thereby to provide an adaptive filter response. The invention as embodied in an adaptive control configuration is illustrated in FIG. 2 and includes in addition to those elements described in FIG. 1, control circuitry 14 having its input coupled to the output of active filter 10 and its output fed back to the control signal input of controller 12. Control circuitry 14 is operative in response to predetermined input signal characteristics to derive a control signal for operation of controller 12 and corresponding operation of filter module 10 to adjust the filter response characteristics accordingly to achieve a given response variation with varying input signal conditions. Such adaptive control is particularly useful, for example, in a radar clutter cancellation system wherein time varying clutter spectra must be cancelled in order to achieve optimum moving target detection in the presence of such clutter. Such a clutter cancellation system is described in detail in copending application Ser. No. 783,289, filed Dec. 12, 1968, entitled Radar Processor Having Adaptive Clutter Rejection, and assigned to the assignee of the present invention. In this instance, control circuitry 14 is operative in response to the frequency and/or amplitude of input clutter signals to adjust the response of filter 10, which in this case typically is a high pass filter, in order to selectively cancel clutter while maintaining an optimum signal to clutter-residue ratio for proper target detection under the particular clutter conditions. The output signal of filter module 10 contains information respresentative of the moving target which can be detected by well known means. The active filter 10 can have a plurality of outputs each providing a different response, and can have an inherent amplification as desired.

Figure 3:
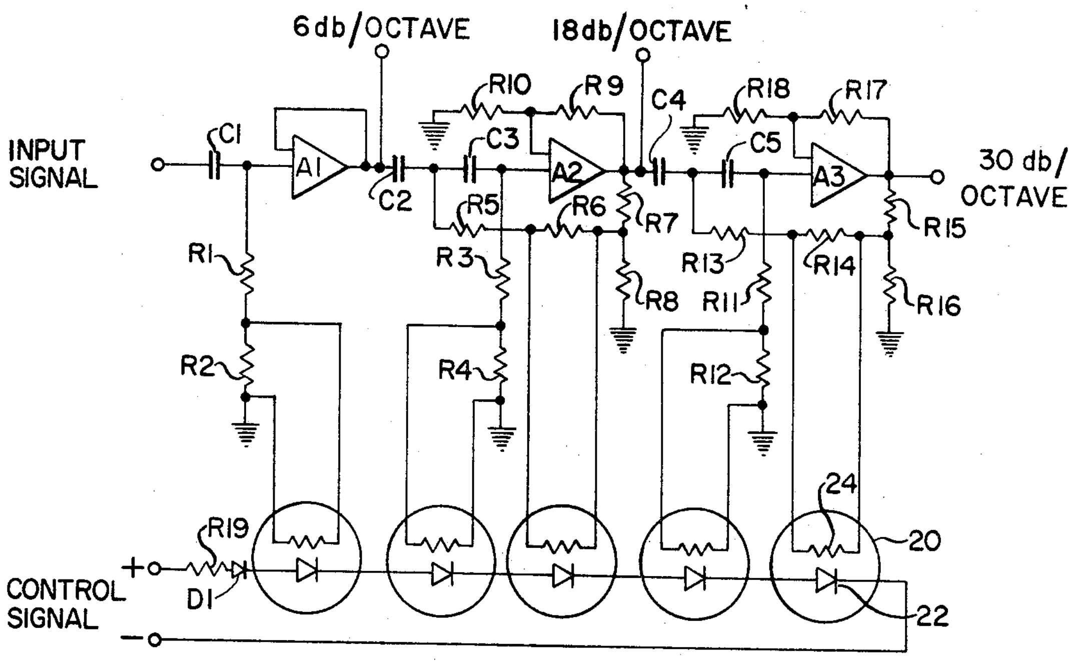
FIG. 3 is a schematic diagram of an embodiment of an active filter according to the present invention.

A schematic diagram of one embodiment of the invention is illustrated in FIG. 3, this embodiment being a five-pole Butterworth high pass filter. The filter comprises a three stage active RC circuit in which equal value resistors are employed as frequency determining elements, the selective variation of the effective resistance of which determines the particular filter response characteristics. An input signal is applied via capacitor C1 to operational amplifier A1 which functions as a voltage follower isolation amplifier. The frequency response of this stage is determined by the combination of capacitor C1 and series connected resistors R1 and R2, as controlled by the light variable resistor as will be described. The output of operational amplifier A1 drives the succeeding two stages which are RC high pass filters, the feedback arrangement of the resistors associated with operational amplifier A2 providing an intended two-pole response. The third filter stage operates similarly to that of the second stage to provide an additional two-pole response, the entire filter thereby providing a five-pole Butterworth response by virtue of the positioning of the poles in proper uniformly spaced positions on a circle of radius equal to the cutoff frequency. An output terminal can be provided at each filter stage, as illustrated, to provide respective outputs of 6, 18 and 30 db/octave.

The controller includes five electro-optical elements 20 each including a light emitting solid state device such as a gallium arsenide phosphide diode 22 and a cadmium sulfide photosensitive cell 24 arranged in juxtaposition to diode 22 for efficient receipt of light energy therefrom. The light emitting diodes 22 are connected in series with a current limiting resistor R19 and a control signal source. Each photosensitive resistor 24 is coupled to a corresponding equal value resistor within the filter circuit. More particularly, each successive photosensitive resistor 24 is coupled in parallel respectively to resistors R2, R4, R6, R12 and R14. For a given light intensity, each photosensitive resistor 24 exhibits an equal resistance and this resistance varies uniformly with variations in applied light intensities. Thus, uniform variations in resistance is achieved in the five requisite circuit control positions to provide selected variation of the filter cutoff response. The series resistors R1, R3, R5, R11 and R13 set a limit to the highest cutoff frequency which will be obtained when the photosensitive resistors are at their lowest impedance value, which occurs at maximum illumination levels. Resistors R2, R4, R6, R12 and R14 being of much higher impedance by approximately two orders of magnitude, largely determine the minimum cutoff frequency which is obtained when the photosensitive resistors are at their highest value, which occurs at zero illumination level.

As an example of typical circuit values, the invention as embodied in the circuit of FIG. 3 has been constructed and successfully operated with the following components and values:

| | |
|---|---|
| Operational amplifiers A1, A2 and A3 | Fairchild 741C. |
| Resistors R1, R3, R5, R11, R13 | 5K ohms. |
| Resistors R2, R4, R12, R14 | 100K ohms. |
| Resistors R7, R15 | 3.9K ohms. |
| Resistors R8, R10, R16, R18 | 1K ohms. |
| Resistors R9, R17 | 9.1K ohms. |
| Resistor R19 | 51 ohms. |
| Capacitor C1 | 6.4 $\mu$farads. |
| Capacitors C2, C5 | 10.3 $\mu$farads. |
| Capacitors C3, C4 | 4.0 $\mu$farads. |
| Diode D1 | IN4154. |
| Gallium arsenide phosphide diodes 22 | Monsanto MV10B3. |
| Cadmium sulfide resistors 20 | Clairex CL905HLL. |

With the values given above, the filter has a cutoff frequency of 0.25 Hz. when no control signal is applied to the photodiodes of the controller 12, and a cutoff frequency of 2.5 Hz. with maximum control current of approximately 10 milliamperes. This particular filter configuration is especially useful in the processing of radar moving-target signals which exist in the presence of clutter as described hereinabove. By use of the novel filter, radar processing of target data can be achieved in an optimum manner since the filter response is adaptable to particular clutter conditions. Of course, the filter cutoff frequency and its range of variability can be chosen to suit particular operating requirements. In general, circuits of the type illustrated in FIG. 3 can provide a 20:1 range of cutoff frequencies between a minimum cutoff frequency of 0.1 Hz. and a maximum frequency of 20 kHz. Suitable gain can also be provided as required in a particular active filter circuit. When employed in an adaptive clutter rejection system, the control signal is preferably derived from the 18 db/octave output of the filter, while the 30 db/octave output is coupled to the target detection circuitry, so that relatively high clutter energy is provided for control loop operation.

Various modifications and alternative implementations will occur to those versed in the art without departing from the spirit and true scope of the invention. Accordingly, the invention is not to be limited by what has been particularly shown and described.

What is claimed is:

1. An electronically variable filter comprising:

a multi-stage active filter circuit having a plurality of equal value resistive frequency determining elements providing a predetermined filter response characteristic, said filter circuit adapted to receive an input signal and to provide one or more output signals; and electro-optical means cooperative with said plurality of frequency determining elements to selectively and uniformly vary the effective value thereof in response to a control signal thereby to selectively vary the filter response characteristic, said electro-optical means including:

a like plurality of equal value matched photosensitive resistors each coupled to a respective frequency determining element and each being in light coupling relationship with a respective light source whose intensity is variable in response to said control signal, said light sources being connected in series with a source of said control signal and operative to cause uniform variation of the resistance of said photosensitive resistors corresponding to the magnitude of said control signal.

2. An electronically variable filter according to claim 1 wherein said active filter circuit comprises a high pass filter, the cutoff frequency of which is selectively variable in response to said control signal.

3. An electronically variable filter according to claim 1 wherein said photosensitive resistors are photosensitive solid state cells and said light sources are light emitting-diodes connected in series with a source of said control signal.

4. An electronically variable filter according to claim 3 wherein said active filter circuit comprises a five-pole Butterworth high pass filter, the cutoff frequency of which is selectively variable in response to said control signal.

References Cited

UNITED STATES PATENTS

| | | | |
|---|---|---|---|
| 2,989,887 | 6/1961 | Markowitz | 84—1.24 |
| 3,182,271 | 5/1965 | Aiken | 330—59 XR |
| 3,202,926 | 8/1965 | Ford et al. | 330—59 |
| 3,281,723 | 10/1966 | Mercer | 333—18 |
| 3,316,341 | 4/1967 | Peterson | 333—18 XR |
| 3,327,210 | 6/1967 | Wu | 333—70 XR |
| 3,354,316 | 11/1967 | Deverall | 250—217 |

FOREIGN PATENTS

| | | |
|---|---|---|
| 1,088,131 | 10/1967 | Great Britain. |

OTHER REFERENCES

"Radiotron Designer's Handbook," Langford-Smith, 4th edition; Amalgamated Wireless Valve Company PTY. LTD. Sidney, Australia, 1953, TK6563 L34; pages 172–176.

HERMAN K. SAALBACH, Primary Examiner

M. NUSSBAUM, Assistant Examiner

U.S. Cl. X.R.

333—70; 330—86, 109; 250—217